United States Patent [19]

Sakaue

[11] Patent Number: 5,753,944
[45] Date of Patent: May 19, 1998

[54] LAYOUT OF BUTTING CONTACTS OF A SEMICONDUCTOR DEVICE

[75] Inventor: Hisashi Sakaue, Kyoto, Japan

[73] Assignee: Rohm Co. Ltd., Kyoto, Japan

[21] Appl. No.: 674,824

[22] Filed: Jul. 3, 1996

[30] Foreign Application Priority Data

Jul. 6, 1995 [JP] Japan ................................. 7-171087

[51] Int. Cl.⁶ ........................................... H01L 27/105
[52] U.S. Cl. ................... 257/206; 257/343; 257/369; 257/372; 257/773
[58] Field of Search ................ 257/202–211, 341–343, 257/369, 372, 773, 776

[56] References Cited

U.S. PATENT DOCUMENTS 5,404,034  4/1995  Yin ........................... 257/206

Primary Examiner—Tom Thomas
Assistant Examiner—David B. Hardy
Attorney, Agent, or Firm—Baker & Botts, L.L.P.

[57] ABSTRACT

A semiconductor device having a butting-contact structure for stabilized contact resistance is disclosed. The semiconductor device includes, in the same number, PN regions each having a source region and a diffusion layer in the order with respect to a Y-axis positive direction and PN regions each having a source region and a diffusion layer placed reverse thereto. MOSFET elements have an identical shape in their PN contacts. The interval of the PN contacts is determined equivalent to the interval of boundary lines of the ON regions. The PN contacts are provided such that their centers substantially align with respective boundary lines of the PN regions. Therefore, even when deviation occurs between the PN region and the PN contact along the Y-axis direction, there is provided a equivalency between the sum of areas of the source contact and the sum of areas of the diffusion layer contacts throughout the device.

5 Claims, 10 Drawing Sheets

LAYOUT OF BUTTING CONTACTS OF A SEMICONDUCTOR DEVICE

BACKGROUND OF THE INVENTION

This invention relates to semiconductor devices, and more particularly to layout configuration of butting contacts for semiconductor devices.

A power MOSFET device of a lateral type is used as a semiconductor device for applications such as electric power supply and so on. The lateral power MOSFET device has butting contacts in order to maintain a source potential at the same level as a potential of a substrate. The butting contact is a structure of an electrical contact, in which connection is made between a source region of a first conductivity type and a highly-doped diffusion region of a second conductivity type, i.e., for a butting contact, within a substrate doped not high of a second conductivity type. With such structure, the potential of the source region and the potential of the substrate is kept in a same level. Butting contacts are sometimes provided in a well region doped not high with an impurity concentration of the second conductivity type in a substrate, as the case may be.

There is illustrated in FIG. 10A a plan configuration of a lateral power MOSFET device 2 provided with a conventional butting contact structure, while FIG. 10B shows a cross section taken on the line P1—P1 in FIG. 10A. As shown in the figures, the conventional power MOSFET 2 device includes a plurality of MOSFET elements 6 formed in a parallel relation in a substrate 4. These MOSFET elements 6 have respective gate electrodes G which are connected together through a gate interconnection 8. The MOSFET elements 6 also have respective drain regions D which are connected together by a drain interconnection 12 via drain contacts 10, as well as respective source regions S which are connected together by a source interconnection 16 via source contacts 14a.

In each MOSFET element 6, a diffusion layer BT is formed to provide a butting contact at a location adjacent to an end of the source region S with respect to a positive direction of a Y-axis. The diffusion layer BT is in electrical connection with the source region S through a diffusion layer contact 14b formed continuous to a source contact 14a. The source contact 14a and the diffusion layer contact 14b cooperate to constitute a PN contact 14.

By thus adopting a butting-contact structure, the source region S and the substrate 4 can be held at a same potential level.

However, there have been a disadvantage in the conventional butting-contact structure. That is, source regions S or diffusion layers BT are formed through a different mask process from the process of providing the contact holes for PN contacts 14. The separate mask process results in misalignment of mask patterns, resulting from limitation in accuracy of positioning masks during the processes.

Specifically, if the mask pattern is misaligned in a sole direction of an X-axis as shown in FIG. 11A, such misalignment if small may be covered, and hence there is no practical problem. However, a problem arises when misalignment of a mask pattern involves a component thereof in a direction of the Y-axis, as shown in FIG. 11B, i.e., when a boundary line 18 defined between the source region s and the diffusion layer BT misaligns relative to a center of a contact hole for a PN contact 14 in the Y-axis direction.

If a mask for the contact hole for provision of the PN contact 14 misaligns toward a positive direction of the Y-axis relative to a mask for the source region S for instance, an exposed area of the source region S decreases within the PN-contact contact hole. To this end, when a source interconnection 16 is provided, there encounters reduction of area for the source contact 14a, i.e., reduction of an area contacting between the source interconnection 16 and the source regions S.

Meanwhile, contact resistance is characterized to increase with decrease in contact area. On the other hand, variation in contact resistance tends to increase with decrease of contact area. With respect to the above case, there will be increase in contact resistance between the source interconnection 16 and the source region S, together with increase in variation of contact resistance.

On the other hand, if a mask for PN-contact 14 contact holes misaligns toward a negative direction of the Y-axis, there arises decrease in area of a diffusion layer contact 14b, i.e., the contact area between the source interconnection 16 and the diffusion layer BT. This results in increase in the contact resistance between the source interconnection 16 and the diffusion layer BT, together with increase in variation of the contact resistance.

That is, misalignment of a mask, regardless of positive or negative in the Y-axis direction, causes increase of contact resistance together with variation thereof for the source region S and the diffusion layer BT which are connected through the source interconnection 16.

Thus, in the conventional butting-contact structure, it is difficult to stabilize contact resistance due to misalignment of masks during mask processes. The variation in contact resistance is a major factor of an unexpectable difference in potential level between the source region S and the substrate 4, leading to malfunctioning of the MOSFET device.

SUMMARY OF THE INVENTION

It is therefore an object of the invention to eliminate the problems encountered in the conventional butting contact, and provide a semiconductor device of a lateral power MOSFET which is of a butting-contact structure with stabilized contact resistance.

According to the present invention, there is provided a semiconductor device comprising:

a plurality of contact regions each having a first region of a first conductivity type and a second region of a second conductivity type formed adjacent to a first region;

an interconnection having a plurality of contact portions provided corresponding to the contact regions and a connecting portion connecting between the contact portions for electrical connection between the contact regions, the contact portions each contacting with a contact region at both the first region and the second region for electrical connection between the first region and the second region;

the semiconductor device involving, substantially in the same number, contact regions having the first region and the second region in the order with respect to a predetermined direction and contact regions having the first region and the second region in the order with respect to the reverse direction to the predetermined direction;

whereby the contact portions are provided constant in the sum of areas contacting with the first regions or the sum of areas contacting with the second regions.

Thus, the semiconductor device of the invention includes, in the same number, contact regions each of which has a first region and a second region provided in the order with respect to a predetermined direction and contact regions each of which has a first region and a second region in the order with respect to a reverse direction to the predetermined direction, so that the sum of areas of the contact portions in contact with the first regions or the sum of areas of the contact regions in contact with the second regions is substantially constant regardless of position of the contact portion relative to the boundary line between the first and second region.

Consequently, even when the contact portions are misaligned relative to the boundary lines toward the above predetermined direction or the reverse direction thereto, the amount in variation is appropriately offset for the area of the contact portions contacting with the first regions or the area of the contact portions with the second regions by virtue of the arrangement that the first region and the second region are positioned in the order toward the predetermined direction and further the first region and the second region are positioned in the order toward the reverse direction thereto.

Thus, there is offered substantial constancy in the sum of areas in contact with the first regions or the sum of areas in contact with the second regions, regardless of relationship in position between the contact portions and the boundary lines.

Preferably, the contact portions may be substantially identical in shape of contacting, and the interval of the contact portions in the predetermined direction being substantially identical to the interval of boundary lines defined between the first region and the second region.

Arrangement in the predetermined direction may be made in an alternate manner by the contact region having the first region and the second region arranged in the predetermined direction and the contact region having the first region and the second region arranged in the reverse direction to the predetermined direction, and the contact portions being provided so as to be aligned with respective ones of the boundary lines of the contact regions.

Arrangement in a direction perpendicular to the predetermined direction may be made in an alternate manner by the contact region having the first region and the second region arranged in the predetermined direction and the contact region having the first region and the second region arranged in the reverse direction to the predetermined direction, and the contact portions being provided so as to be aligned with respective ones of the boundary lines of the contact regions.

With such arrangement, there is provided substantial equivalency between the sum of areas in contact with the first regions and the sum of areas in contact with the second regions.

More preferably, the semiconductor device of the invention may have a plurality of MOSFET elements, the first region is a source region of a first conductivity type formed in a semiconductor substrate of a second conductivity type having not-high impurity concentration or in a well region of a second conductivity type having not-high impurity concentration formed in a semiconductor substrate, and the second region being a region of a second semiconductor type having high impurity concentration formed in the semiconductor substrate or the well region.

Thus, the semiconductor device includes a plurality of MOSFET elements having a source region of a first conductivity type formed as the first region and a highly doped region of a second conductivity type formed as the second region in the substrate or a well region.

With such arrangement, the MOSFET elements of the semiconductor device is provided with source regions having a potential kept in the same level as the substrate or a well region.

DETAILED DESCRIPTION OF THE INVENTION

Figure 2:
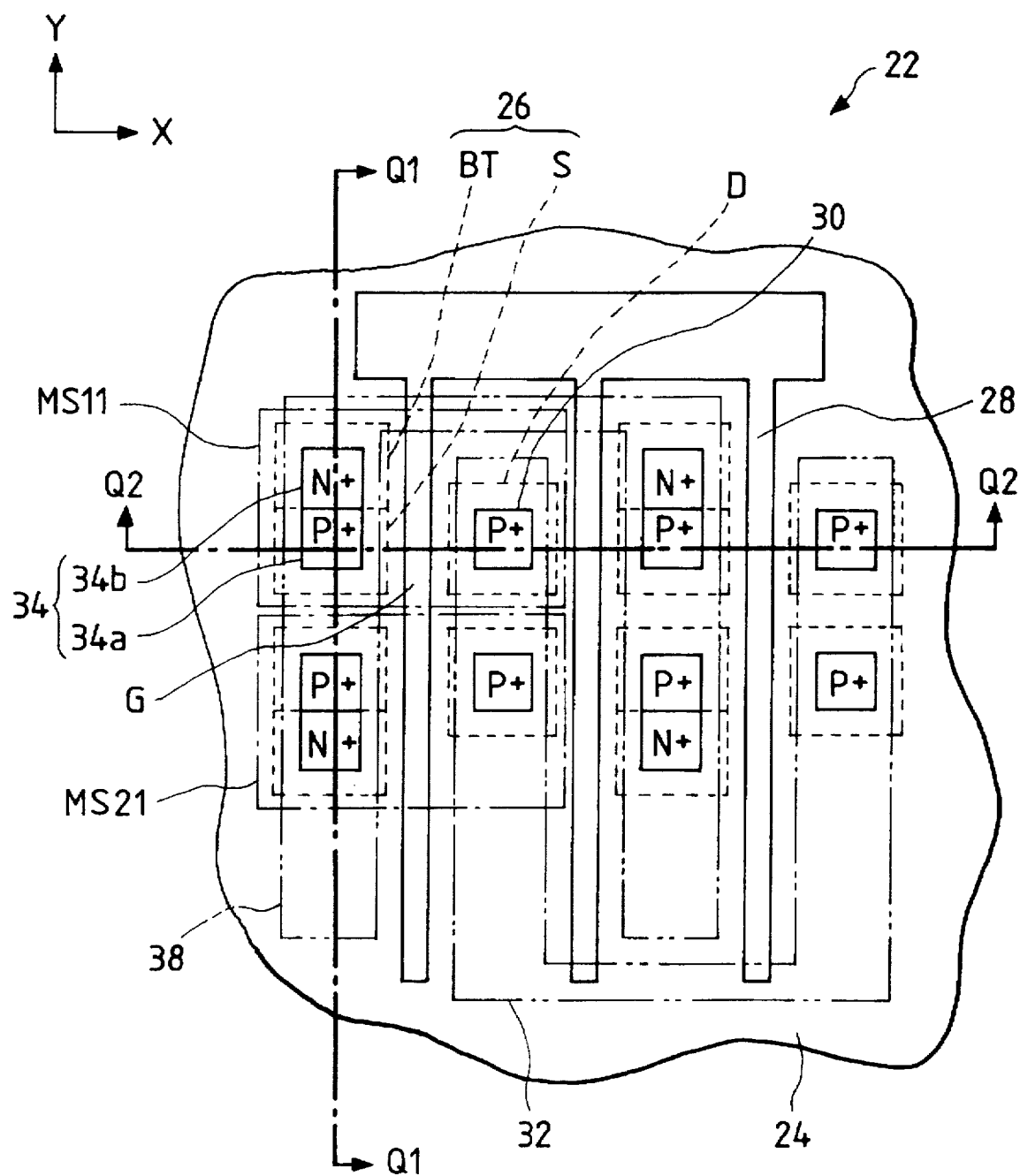
FIG. 2 is a plan view of a butting-contact structure for a lateral power MOSFET device of FIG. 1.
Figure 5:
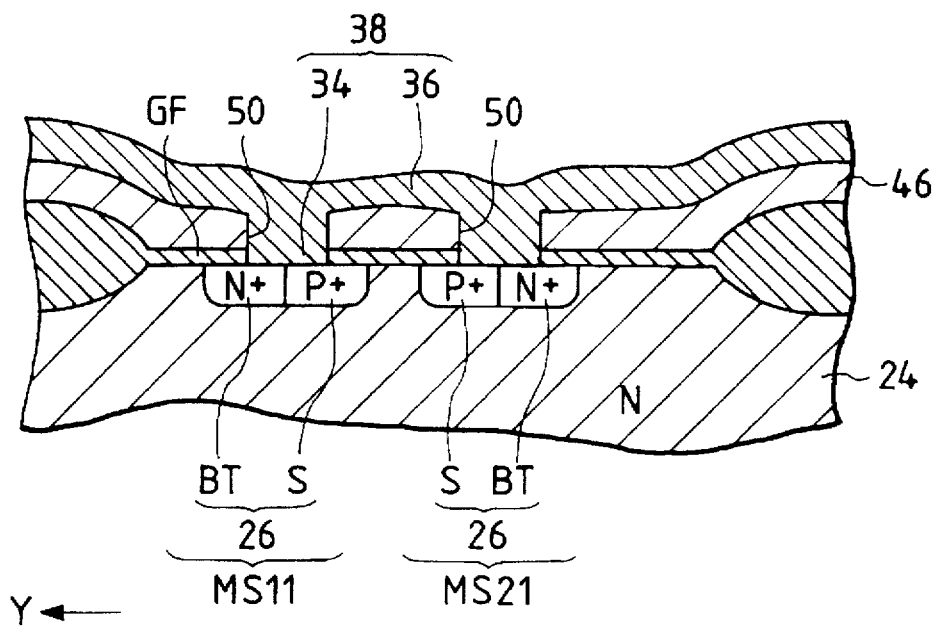
FIG. 5 is a sectional view taken on line Q1—Q1 in FIG. 2, showing a complete butting-contact structure.
Figure 6:
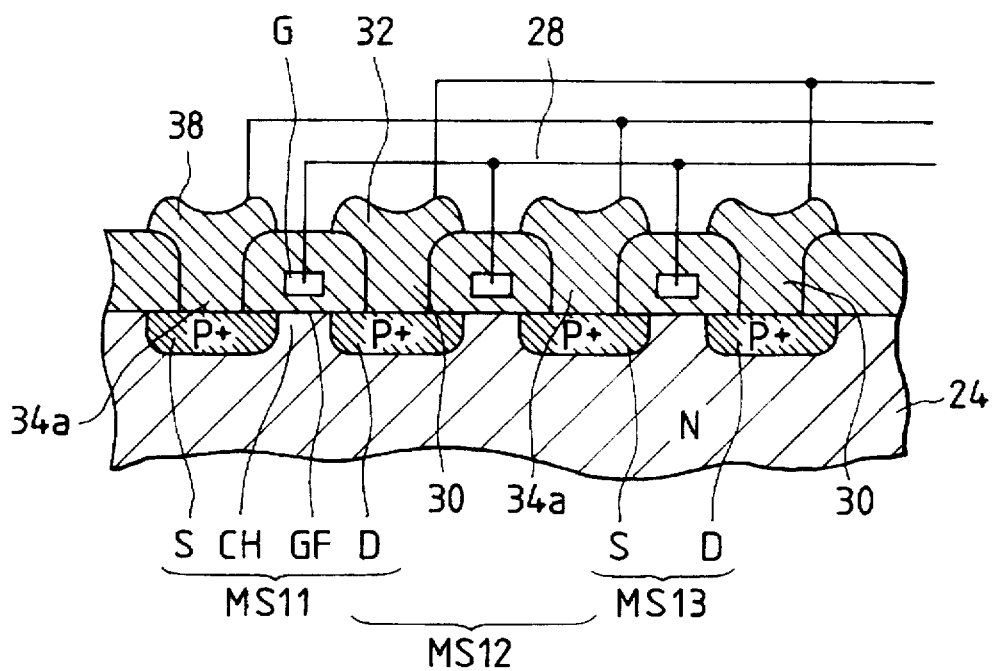
FIG. 6 is a sectional view taken on line Q2—Q2 in FIG. 2.

First, referring to FIG. 2, there is illustrated a plan configuration of a lateral power MOSFET device having a butting contact structure, which constitute a semiconductor device according to one embodiment of the invention. On the other hand, FIG. 5 shows a sectional view of the lateral power MOSFET device taken on the line Q1—Q1 in FIG. 2, while FIG. 6 is a sectional view on the line Q2—Q2 in the same figure.

As shown in FIG. 2, the power MOSFET device 22 has a plurality of MOSFET elements MS11, MS21, etc. arranged in a parallel relation in a semiconductor substrate. The substrate is of a second or N conductivity type with not high concentration of an impurity. Each of the MOSFET element MS11, MS21, etc. has, as shown in FIG. 6, a source region S and a drain region D of a first or a P conductivity type respectively formed in the substrate 24, and a channel region CH provided between the source region S and the drain region D. A gate electrode G is formed of polysilicon over the channel region CH through a gate oxide film GF. Thus, these MOSFET elements MS11, MS21, etc. cooperate to constitute a P-channel type MOSFET device.

The gate electrodes G of the MOSFET elements MS11, MS21, etc. are connected together through a gate interconnection 28, as shown in FIG. 2. The drain regions D are connected together through a drain interconnection 32 via respective drain contacts 30, whereas the source regions S are connected together through a source interconnection 38 via respective source contacts 34a. As shown in FIG. 5, the source interconnection 38 includes PN contact 34, hereinafter referred, and connecting portions 36 electrically connecting between the PN contacts 34.

Figure 1B:
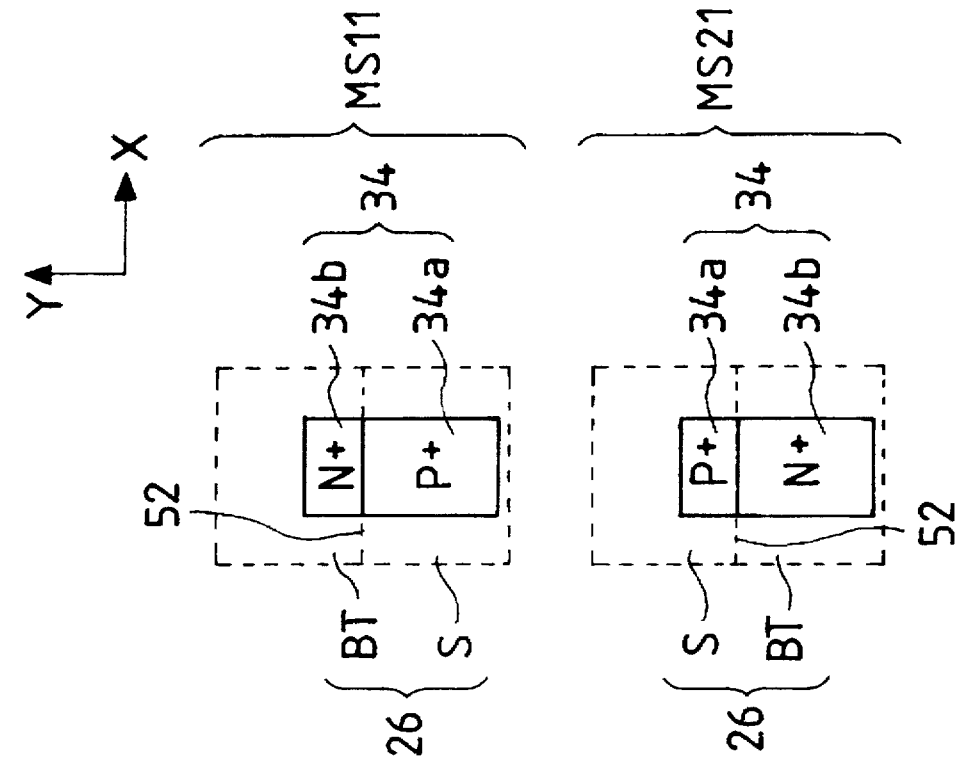
FIGS. 1A and 1B are enlarged plan schematic views of butting contacts for a lateral power MOSFET device according to one embodiment of the invention.
Figure 1A:
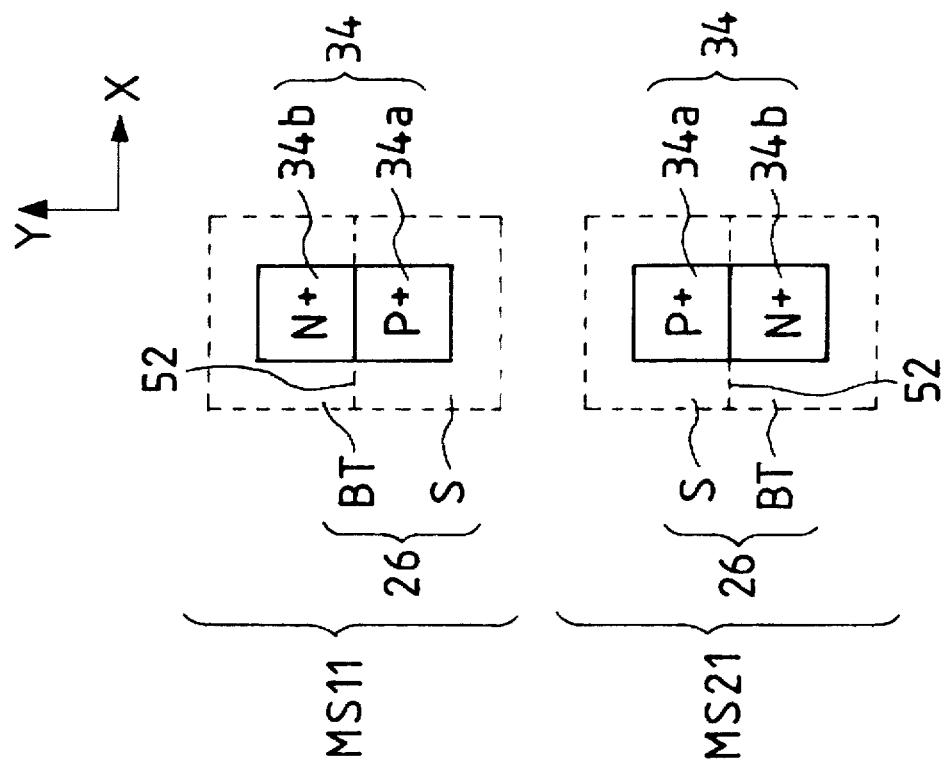

The MOSFET element MS11 has a diffusion layer BT as a second region for forming a butting contact, as enlargedly shown in FIG. 1A, which layer is formed adjacent an end of the source region S with respect to a positive direction of a Y-axis. The source region S and the diffusion region T cooperatively constitute a PN region 26.

The diffusion region BT is of an N conductivity type having high impurity concentration, which is formed in a substrate 24 of the N conductivity type having low impurity concentration, as shown in FIG. 5. The diffusion layer BT is electrically connected to the source region S through a diffusion layer contact 34b formed continuous to or integral with a source contact 34a. The source contact 34a and the diffusion contact 34b thus continuously structured provides the PN contact 34 as a contact portion.

The MOSFET element MS 21 also has a diffusion layer BT as a second region for a butting contact. However, this diffusion layer BT is located adjacent to an end of the source region S with respect to a negative direction of the Y axis, in a reverse manner to the case of the MOSFET element MS11. The MOSFET element MS21 is constituted similar to the MOSFET element MS11 in other respects.

In this embodiment, the lateral power MOSFET device 22 includes, in the same number, two types of PN regions 26 alternately arranged in the Y-axis direction. That is, PN regions 26 of one type, as in the MOSFET elements MS11, are formed by a source region S and a diffusion layer BT, whereas PN regions 26 of the other type, as in MOSFET elements MS21, are formed by a source region S and a diffusion layer BT placed in the order with respect to the negative direction of the Y-axis.

These contacts 34 of the MOSFET elements MS11, MS21, etc. are the same in shape and area throughout the device. The PN contacts 34 are formed along the Y-axis direction at an interval therebetween which is equivalent to an interval of boundary lines 52 each defined between a source region S and a diffusion layer BT associated therewith. Further, the PN contacts 34 are provided such that they are aligned with the respective boundary lines 52 of the PN regions 26 at a center of contacting thereof.

Figure 3A:
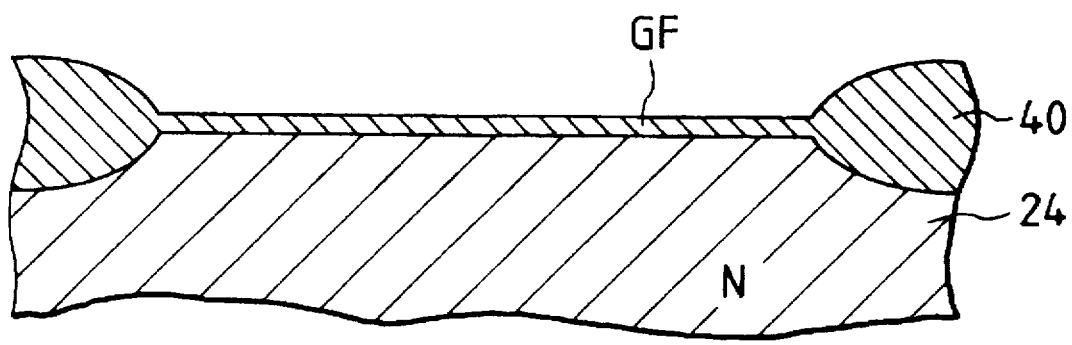
FIGS. 3A and 3B are sectional views taken on line Q1—Q1 in FIG. 2, showing processes of early stages of manufacturing the butting contact structure.

The method of manufacturing the lateral power MOSFET 22 device will then be explained. FIG. 3 to FIG. 5 show manufacturing processes, which are given by a sectional view taken on the line Q1—Q1 in FIG. 2. First, a gate oxide film GF is formed of silicon oxide and then a LOCOS layer 40 is grown for device isolation over an N conductivity type substrate 24, as shown in FIG. 3A. After formation of the gate oxide film GF and the LOCOS layer 40, gate electrodes G are formed of polysilicon.

Figure 3B:
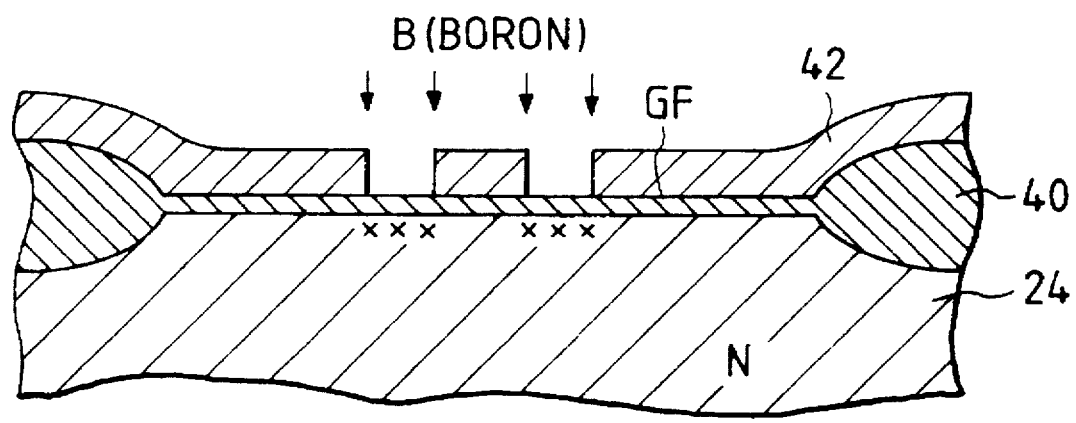

Then, boron (B) as a P-type impurity is introduced into source-forming regions S of the substrate, as shown in FIG. 3B. The introduction of boron is performed by first patterning resist layer 42 to a predetermined form over the gate oxide film GF and the LOCOS layer 40, and then introducing high concentration of boron ion implantation with utilizing the resist layer 42 as a mask. In the figure, the regions marked with represent ion implantation. Incidentally, drain-forming regions D are also introduced with boron in this process.

Figure 4A:
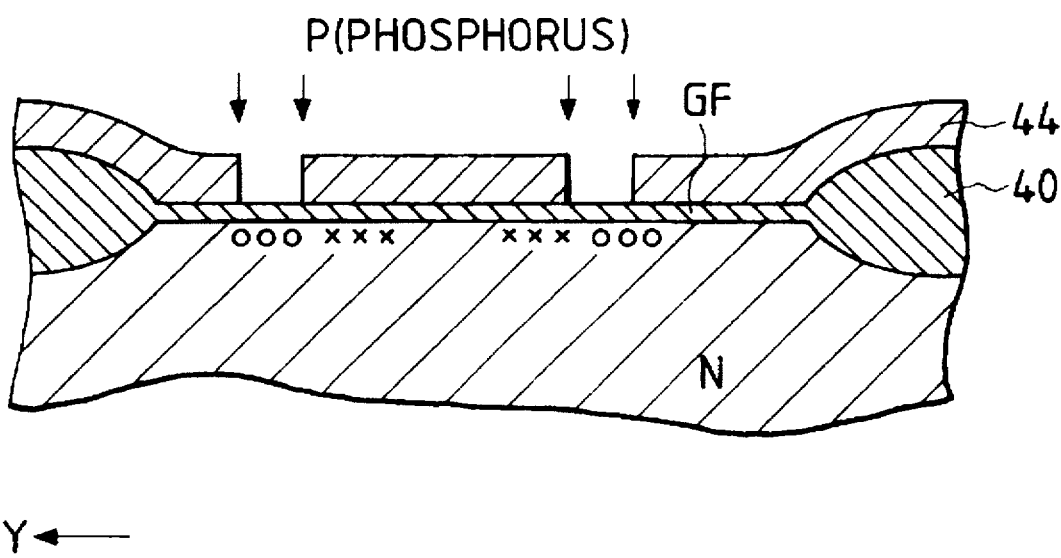
FIGS. 4A and 4B are sectional views taken on line Q1—Q1 in FIG. 2, showing processes of later stages of manufacturing the butting contact structure.

Phosphorus (P) is then introduced as an N type impurity into areas to be formed into diffusion layers BT for providing butting contacts in the substrate 24, as shown in FIG. 4A.

In introducing phosphorus, the resist layer 42 utilized in the previous process is stripped off, and a predetermined form of resist layer is newly patterned over the gate oxide film GF and the LOCOS layer 40. Subsequently, high concentration of phosphorus is ion implanted through the resist layer 44 as a mask. In the figure, the regions marked with o represent areas implanted with phosphorus.

Figure 4B:
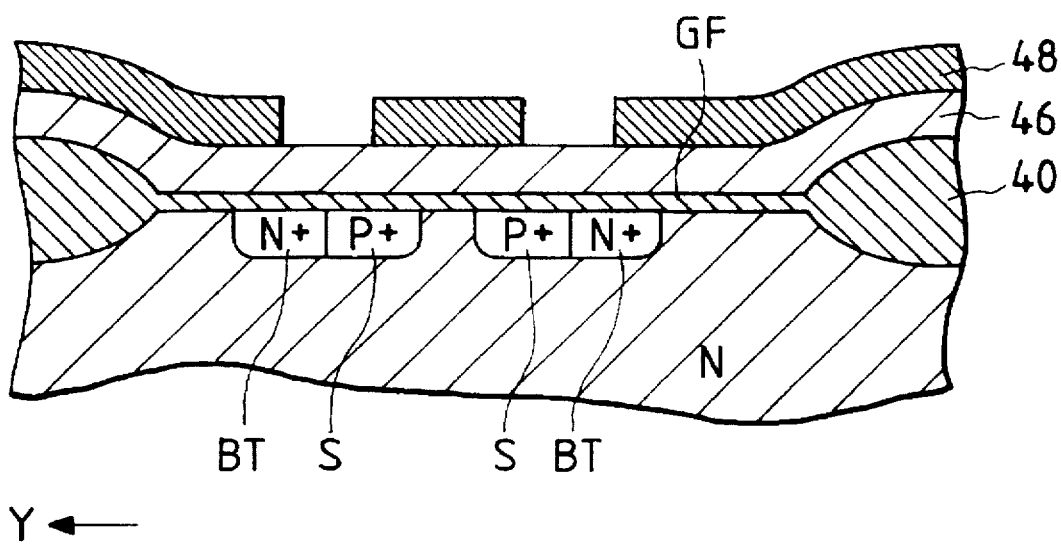

Next, an interlayer film 46 is formed, and a resist layer 48 is applied thereon and patterned for forming a PN contact 34, as shown in FIG. 4B. The formation of the interlayer film 46 is performed by first stripping off the resist layer 44 utilized in the previous process and then depositing a silicon oxide SiO2 by a CVD technique over the gate oxide film GF and the LOCOS layer 40.

The CVD process is followed by annealing in order to thermally diffuse impurities ion-implanted into the substrate 4 in the processes so far, thereby providing source regions S and diffusion layers BT. Thereafter, the resist layer 48 is applied and patterned over the interlayer film 46.

Then, a source interconnection 38 is formed, as shown in FIG. 5. In the formation of the source interconnection, the interlayer film 46 and the gate oxide film GF are selectively removed to provide contact holes 50 for PN contacts 34, as shown in FIG. 5.

Then, an aluminum film is formed by sputter over the interlayer film 46, which is patterned to a predetermined form to provide the source interconnection 38. Incidentally, in this process, a drain interconnection 32 shown in FIG. 6 is also provided. In this manner, the lateral power MOSFET device 22 is constructed.

During the fabrication process of the lateral power MOSFET 22 device, there is a possibility of arising misalignment between the patterns of the resist layer 42, 44 and the resist layer 48. As was stated, the resist layer 42, 44 is utilized as a mask for forming the source regions S or the diffusion layer BT, as shown in FIGS. 3B and 4A, whereas the resist layer 48 is used for a mask process for forming the contact holes 50 for providing the PN contacts 34, as shown in FIG. 4B.

The misalignment between the resist layer 42, 44 and the resist layer 48 results in deviation in position between the PN region and the PN contact, as shown in FIG. 1. In such cases, when the misalignment is along a direction of the X-axis as viewed in the figure, such misalignment if small is covered.

In the meanwhile, the lateral power MOSFET device 22 of the invention can compensate for misalignment even where it involves a component along the direction of the Y-axis as viewed in the figure. In this respect, explanation will be furthered for a case where the PN contact 34 deviates toward the negative direction of the Y-axis relative to the PN region 26, as shown FIG. 1B. It is noted that the PN region 26 in this meaning refers more closely to the boundary line 52 between the source region S and the diffusion layer BT in the PN region.

In such a case, the MOSFET element MS11 has, in the PN contact 34, a source contact 34a increased in area and a diffusion contact 34b decreased of area. On the contrary, the MOSFET element MS21 has conversely an decreased area of a source contact 34a with an increased area of a diffusion contact 34b, in the PN contact 34.

However, the MOSFET elements MS11 and MS21 are the same in shape and area of contacting. Further, the interval of the PN contacts arranged in the Y-axis direction is provided equivalent to the interval of the boundary lines 52 of the PN regions 26.

Therefore, the amount of increase in area for the source contact 34a of the MOSFET element MS11 becomes equal to the amount of decrease in area of the source contact 34a of the MOSFET element MS21, thus providing offset in amount between the increase and decrease of these areas. In this manner, there is provided constancy in the sum of areas for the source contact 34a of the MOSFET element MS11 and the source contact 34a of the MOSFET element MS21.

Similarly, the sum of the diffusion contact 34b of the MOSFET element MS11 and the area of the diffusion contact 34b of the MOSFET element MS21 always becomes constant.

Further, as mentioned above, the center of the PN contact 34 is positioned to almost coincide with the boundary lines 52 of the PN regions 26. Thus, the sum of area of the source contact 34a of the MOSFET element MS11 and the area of the source contact 34a of the MOSFET MS21 always becomes almost equal to the sum of the area of the diffusion contact 34b of the MOSFET element MS11 and the area of the diffusion contact 34b of the MOSFET element MS11.

Further, as mentioned above, the PN regions 26 each formed of the source region S and the diffusion layer BT arranged in this order in the positive Y-axis direction, and the PN regions 26 each formed of the source region S and the diffusion layer BT arranged in this order in the negative Y-axis direction, are respectively arranged to be equal to one another in number. By the above reasons, irrespective of the position shift between the PN region 26 and the PN contact 34, as the entire of the lateral power MOSFET device 22, the sum of the area of the source contacts 34a always becomes almost equal to the sum of the area of the diffusion contacts 34b.

Figure 7A:
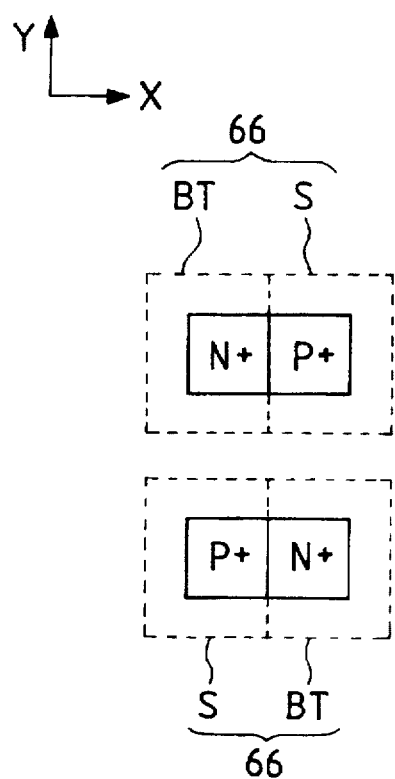
FIGS. 7A and 7B are enlarged plan schematic views of butting contacts according to another embodiment of the invention.
Figure 7B:
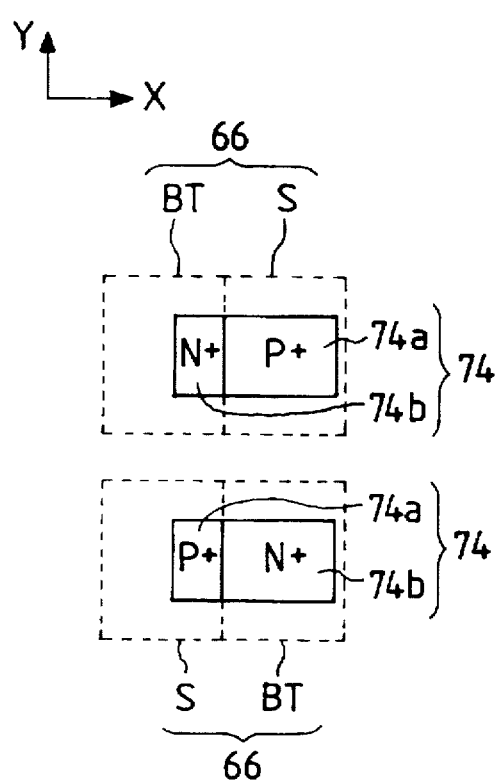

In the above embodiment, as shown in FIG. 1A, the PN regions 26 each formed of the source region S and the diffusion layer BT arranged in this order in the positive Y-axis direction, and the PN regions 26 each formed of the source region S and the diffusion layer BT arranged in this order in the negative Y-axis direction are respectively arranged alternately in the Y direction to be equal to one another in number. However, as shown in FIG. 7A, the PN regions 66 each formed of the source region S and the diffusion layer BT arranged in this order in the positive X-axis direction, and the PN regions 66 each formed of the source region S and the diffusion layer BT arranged in this order in the negative X-axis direction may be respectively arranged alternately in the Y-axis direction to be equal to one another in number. That is, the direction in which the source region S and the diffusion layer BT are arranged, may be orthogonal to the direction in which the respective PN diffusion layers 66 are arranged.

Where the butting contacts are arranged as shown in FIG. 7A, the sum of areas of the source contacts 74a is almost equivalent to the sum of areas of the diffusion layer contacts 74b throughout the lateral power MOSFET device, regardless of deviation between the PN region 66 and the PN contact 74, as shown in FIG. 7B.

Figure 8C:
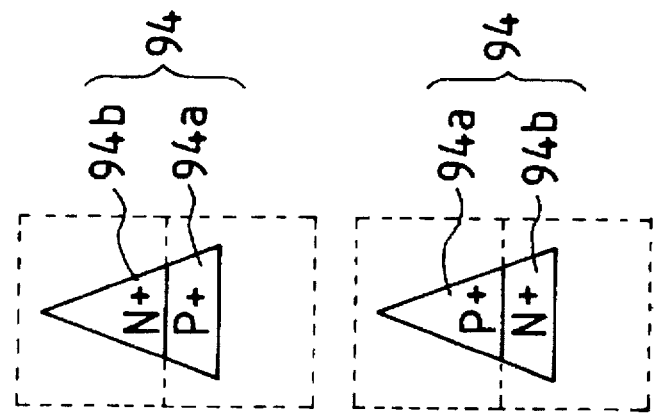
FIGS. 8A to 8C are enlarged plan schematic views of butting contacts according to further embodiment of the invention.
Figure 8B:
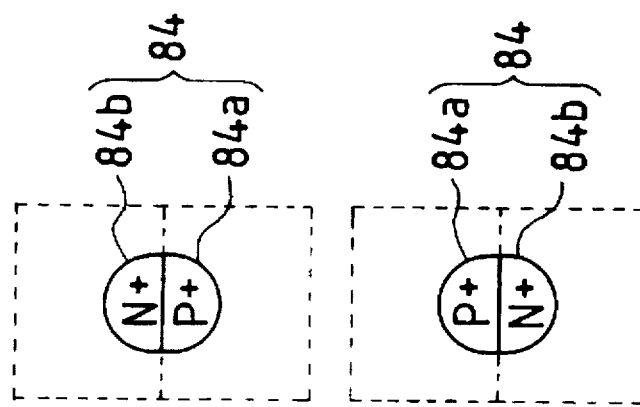
Figure 8A:
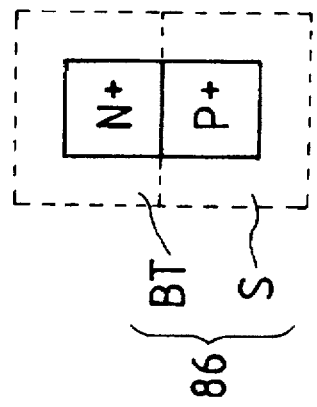

Alternatively, it is possible to determine a direction of placing the PN regions 86, e.g., in a direction U, as desired relative to a direction of placing the source region S and the diffusion layer BT, e.g., in a direction Y, as shown in FIG. 8A.

It is also possible to configure the shape of the PN contact 84, 94 as desired, as shown in FIG. 8B or 8C. Besides, the PN contacts 104 may be configured different in shape between PN regions, as shown in FIG. 9A.

Figures 9A, 9B, 9C:
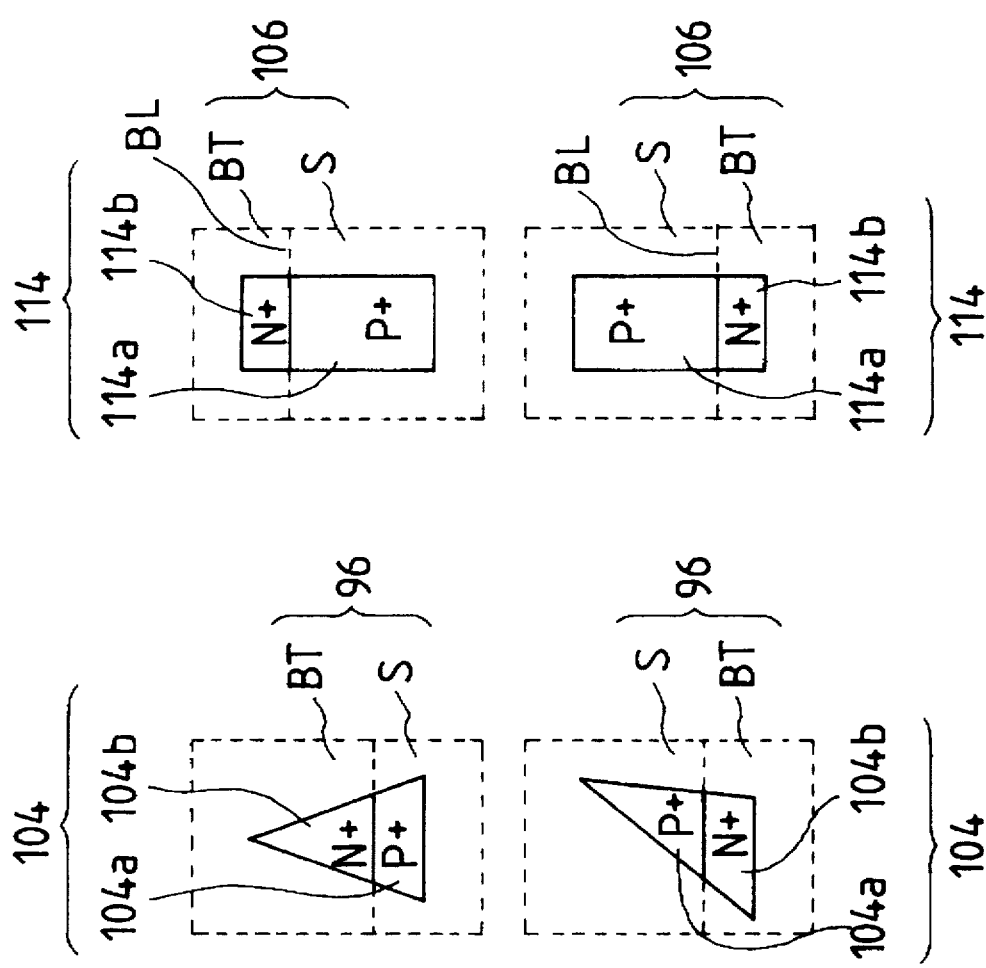
FIGS. 9A to 9C are enlarged plan schematic views of butting contacts according to further embodiment of the invention.
Figure 10A:
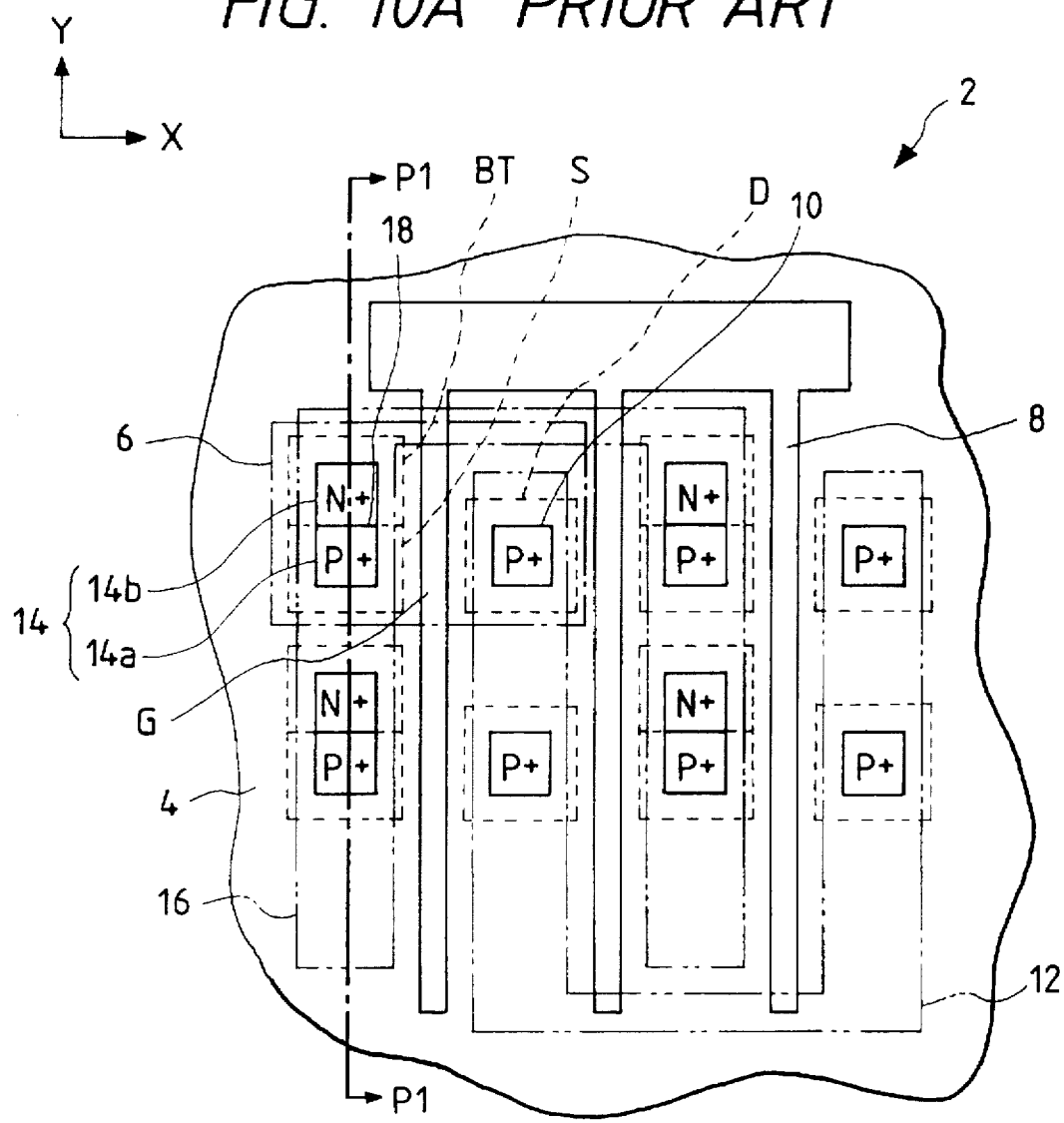
FIGS. 10A and 10B are plan views of a conventional butting-contact structure for a lateral power MOSFET device.
Figure 10B:
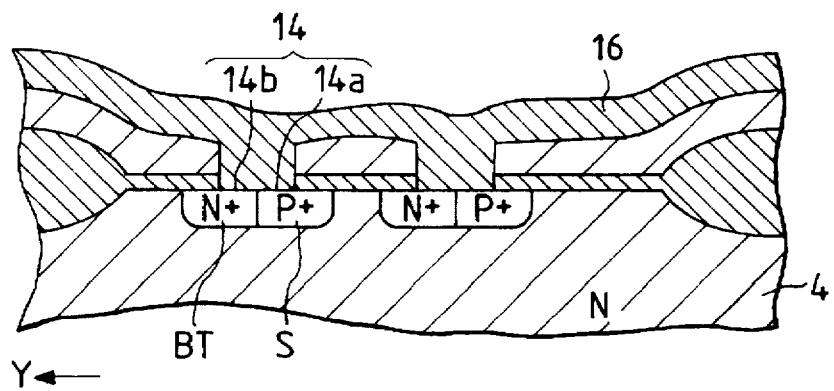
Figure 11A:
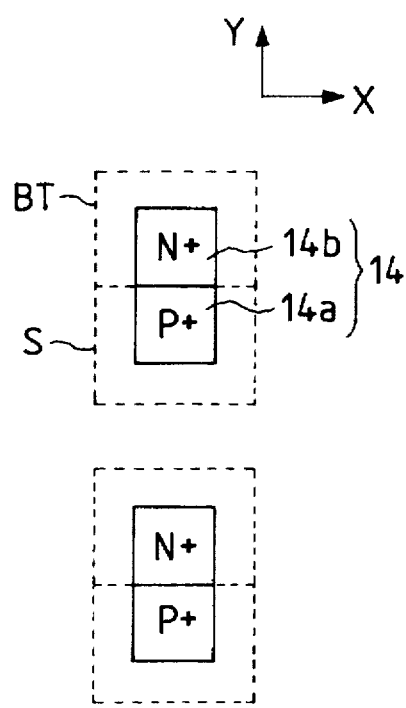
FIGS. 11A and 11B are partly enlarged plan schematic views of the conventional butting-contact structure of FIG. 10.
Figure 11B:
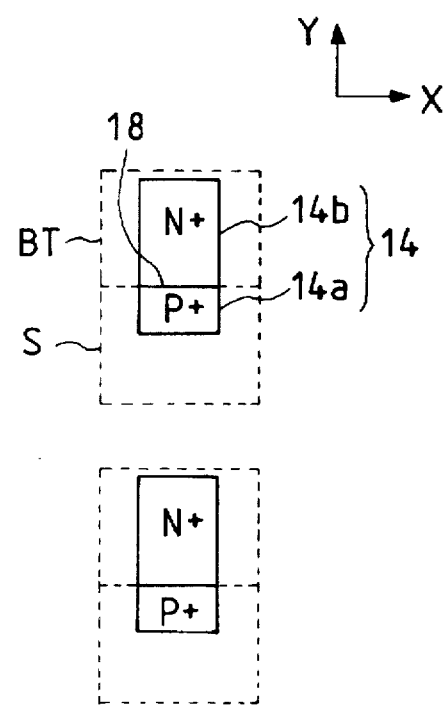
Figure 12:
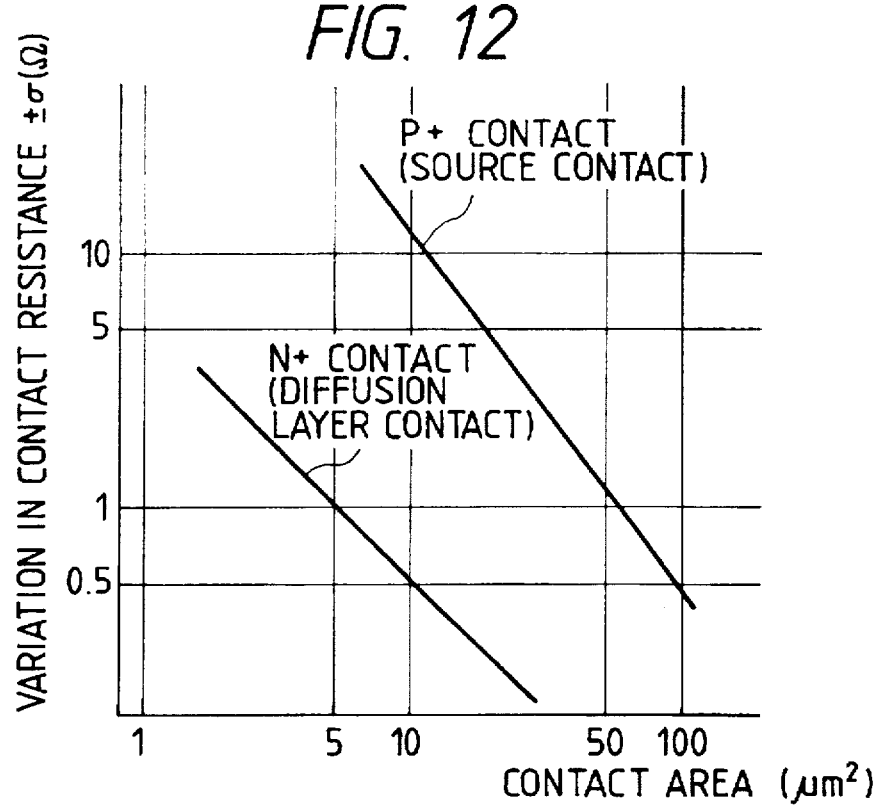
FIG. 12 is a diagram showing the relation between contact area and variation in contact resistance for N+ and P+ contacts.

Further, as shown in FIG. 9B, the interval of the PN contacts 114 may be determined unequal to the interval of the boundary lines BL of the PN regions 106. In such arrangement, equivalency is unavailable between the sum of areas of the source contacts 114a and the sum of areas of the diffusion layer contacts 114b. However, the ratio of these sums may desirably be determined. In such case, the PN contacts 124 may be configured different of area, as shown in FIG. 9C.

Incidentally, the above embodiments were exemplified by a lateral power MOSFET device, but the invention is applicable to other MOSFET devices than the lateral power MOSFET device, or to other semiconductor devices other than MOSFET devices.

As explained above, the semiconductor device of the invention includes, in the same number, contact regions each of which has a first region and a second region provided in the order with respect to a predetermined direction and contact regions each of which has a first region and a second region in the order with respect to a reverse direction to the predetermined direction, so that the sum of areas of the contact portions in contact with the first regions or the sum of areas of the contact regions in contact with the second regions is substantially constant regardless of position of the contact portion relative to the boundary line between the first and second region.

Consequently, even when the contact portions are misaligned relative to the boundary lines toward the above predetermined direction or the reverse direction thereto, the amount in variation is appropriately offset for the area of the contact portions contacting with the first regions or the area of the contact portions contacting with the second regions by virtue of the arrangement that the first region and the second region are positioned in the order toward the predetermined direction and further the first region and the second region are positioned in the order toward the reverse direction thereto.

Thus, there is provided substantial constancy in the sum of areas in contact with the first regions or the sum of areas in contact with the second regions, regardless of relationship in position between the contact portions and the boundary lines. This offers realization of a butting-contact structure with stabilized contact resistance.

The contact portions may be substantially identical in shape of contacting, and the interval of the contact portions in the predetermined direction being substantially identical to the interval of boundary lines defined between the first region and the second region.

With such arrangement, there is provided substantial equivalency between the sum of areas in contact with the first regions and the sum of areas in contact with the second regions, regardless of a relation between the boundary line and the contact portion, thereby realizing a butting-contact structure with stabilized contact resistance.

The semiconductor device of the invention may have a plurality of MOSFET elements, the first region is a source region of a first conductivity type formed in a semiconductor substrate of a second conductivity type having not-high impurity concentration or in a well region of a second conductivity type having not-high impurity concentration formed in a semiconductor substrate, and the second region being a region of a second semiconductor type having high impurity concentration formed in the semiconductor substrate or the well region.

With such arrangement, the MOSFET elements of the semiconductor device is provided with source regions having a potential kept in the same level as the substrate or a well provided in the substrate. It is therefore possible to realize a butting-contact structure with stabilized contact resistance even for a power MOSFET device necessitating a constant potential level between the source and the substrate over a particular wide operating range.

What is claimed is:

1. A semiconductor device comprising:

a plurality of contacts each having a first region of a first conductivity type and a second region of a second conductivity type butting the first region; and an interconnection having a plurality of contact portions provided corresponding to said contacts and a connection connecting said contact portions for electrical connection between said contact regions, said contact portions each contacting both of the first and second conductivity type butting regions of one of the plurality of contacts for electrical connection between said first region and said second region;

wherein the number of contacts having said first region and said second region arranged in that order with respect to a predetermined direction and the number of contacts having said first region and said second region arranged in that order with respect to a direction opposite to said predetermined direction is substantially the same;

whereby a sum of areas of the contact portions contacting said first regions is substantially the same as the sum of areas of the contact portions contacting said second regions if the plurality of contact portions is shifted in the predetermined direction with respect to the plurality of contacts.

2. The semiconductor device of claim 1, wherein said plurality of contact portions have a substantially identical contact shape, and the spacing of said contact portions in said predetermined direction is substantially identical to the spacing of boundary lines separating said first region and said second region in the plurality of contacts.

3. The semiconductor device of claim 2, wherein the arrangement of the contact regions in the plurality of contacts in said predetermined direction is made alternately opposite by alternate contacts having said first region and said second region arranged in the predetermined direction and other alternate contacts having said first region and said second region arranged in the direction opposite to said predetermined direction, and said contact portions are positioned so as to be aligned with respective ones of said boundary lines of said contacts.

4. The semiconductor device of claim 2, wherein the arrangement of the contact regions in the plurality of contacts in a direction perpendicular to said predetermined direction is made alternately opposite by said contacts having said first region and said second region arranged in the predetermined direction and said contacts having said first region and said second region arranged in the reverse direction to said predetermined direction, and said contact portions are aligned with respective ones of said boundary lines of said contact regions.

5. The semiconductor device of any of claims 1 to 4, wherein said semiconductor device has a plurality of MOSFET elements, said first region is a source region of a first conductivity type formed in one of: (a) a semiconductor substrate of a second conductivity type having low impurity concentration and; (b) a well region of a second conductivity type having low impurity concentration formed in a semiconductor substrate, and said second region is a region of a second semiconductor type having high impurity concentration formed in one of: (a) said semiconductor substrate and (b) said well region.

* * * * *